United States Patent
Na et al.

(10) Patent No.: US 7,923,726 B2
(45) Date of Patent: Apr. 12, 2011

(54) TFT SUBSTRATE FOR DISPLAY DEVICE WITH A SEMICONDUCTOR LAYER THAT EXTENDS BEYOND THE GATE ELECTRODE STRUCTURE AND MANUFACTURING METHOD OF THE SAME

(75) Inventors: Byoung-sun Na, Gyeonggi-do (KR); Sang-ki Kwak, Gyeonggi-do (KR); Dong-gyu Kim, Gyeonggi-do (KR); Kyung-phil Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 550 days.

(21) Appl. No.: 11/352,181

(22) Filed: Feb. 10, 2006

(65) Prior Publication Data

US 2006/0180837 A1    Aug. 17, 2006

(30) Foreign Application Priority Data

Feb. 11, 2005    (KR) .................. 10-2005-0011575

(51) Int. Cl.
*H01L 31/113* (2006.01)
(52) U.S. Cl. .................. 257/59; 257/291; 257/E27.11; 257/E29.117
(58) Field of Classification Search .................. 257/59, 257/E29.117, 291, E27.11
See application file for complete search history.

(56) References Cited

U.S. PATENT DOCUMENTS

| | | | | | |
|---|---|---|---|---|---|
| 5,399,884 | A | * | 3/1995 | Wei et al. .................. | 257/59 |
| 5,414,283 | A | * | 5/1995 | den Boer et al. ................. | 257/59 |
| 6,157,048 | A | * | 12/2000 | Powell ............................ | 257/59 |
| 2001/0002855 | A1 | * | 6/2001 | Onisawa et al. ................. | 349/43 |
| 2002/0130324 | A1 | * | 9/2002 | Song et al. ..................... | 257/72 |

FOREIGN PATENT DOCUMENTS

| | | |
|---|---|---|
| JP | 02-089392 | 3/1990 |
| JP | 10-228031 | 8/1998 |
| JP | 2001-308333 | 11/2001 |
| JP | 2002-229068 | 8/2002 |
| JP | 2002-368228 | 12/2002 |
| KR | 2002-0016311 | 3/2002 |
| KR | 10-2004-0018106 | 3/2004 |

* cited by examiner

*Primary Examiner* — Hung Vu
*Assistant Examiner* — Vernon P Webb
(74) *Attorney, Agent, or Firm* — Innovation Counsel LLP (57) ABSTRACT

Disclosed is a TFT substrate for a display apparatus comprising a gate wiring including a gate electrode, a data wiring including a data line, a source electrode connected to the data line, and a drain electrode connected to a pixel electrode, and a semiconductor layer disposed between the gate wiring and the data wiring, wherein the semiconductor layer under the drain electrode is disposed within an area overlapping the gate electrode and the semiconductor layer under the source electrode extends outward to an area not overlapping the gate electrode. Advantageously, the present disclosure provides a TFT substrate for a display apparatus having a high aperture ratio and causing less afterimaging, and a manufacturing method of the same.

12 Claims, 15 Drawing Sheets

TFT SUBSTRATE FOR DISPLAY DEVICE WITH A SEMICONDUCTOR LAYER THAT EXTENDS BEYOND THE GATE ELECTRODE STRUCTURE AND MANUFACTURING METHOD OF THE SAME

CROSS-REFERENCE TO RELATED APPLICATIONS

This application claims the benefit of Korean Patent Application No. 2005-0011575, filed on Feb. 11, 2005, in the Korean Intellectual Property Office, the disclosure of which is incorporated herein by reference.

BACKGROUND

1. Field of the Invention

The present invention relates to a TFT substrate for a display apparatus and a manufacturing method of the same.

2. Description of the Related Art

Since an LCD is thinner, lighter, and consumes less power than a CRT, the LCD has been generally used for a flat panel display. The LCD typically comprises an upper substrate on which a common electrode and color filters are formed, a lower substrate on which pixel electrodes and thin film transistors (TFTs) are formed, and liquid crystals injected between the upper and lower substrates.

A driving circuit drives the TFT corresponding to each pixel, thereby causing liquid crystal molecules to change their orientation. Such change in the orientation of the liquid crystal molecules controls the amount of light transmitted from a backlight to the color filters.

The TFT comprises a gate electrode, a source electrode, a drain electrode, and a semiconductor layer forming a channel area. Amorphous silicon or polysilicon are used for the semiconductor layer, and the amorphous silicon has low off current. However, the amorphous silicon has a disadvantage in that it generates a leakage current when it is irradiated by light. The leakage current prohibits a storage capacitor from maintaining required potential, thereby generating a flickering or an afterimage.

To prevent the amorphous silicon from being exposed to light of the backlight, a full island structure has been introduced which is designed to form the amorphous silicon within a gate electrode area (i.e., formed only in an area overlapping the gate electrode). However, such a structure disadvantageously has a low aperture ratio since the aperture ratio decreases as the size of the gate electrode becomes large, and such a structure also causes RC delay since RC delay increases as an area where data wiring and the gate electrode overlap becomes large.

SUMMARY

Accordingly, it is an aspect of the present invention to provide a TFT substrate for a display apparatus having a high aperture ratio and causing less afterimages, and a manufacturing method of the same.

The foregoing and/or other aspects of the present invention are also achieved by providing a TFT substrate for a display apparatus comprising a gate wiring comprising a gate electrode, a data wiring comprising a data line, a source electrode connected to the data line and a drain electrode connected to a pixel electrode, and a semiconductor layer disposed between the gate wiring and the data wiring, wherein the semiconductor layer under the drain electrode is disposed within an area of the gate electrode and the semiconductor layer under the source electrode extends outward from the gate electrode.

According to an embodiment of the present invention, the semiconductor layer comprises amorphous silicon.

According to another embodiment of the present invention, the TFT further comprises an ohmic contact layer disposed between the semiconductor layer and the data wiring and having the same pattern as the semiconductor layer.

The foregoing and/or other aspects of the present invention are also achieved by providing a TFT substrate for a display apparatus comprising a gate wiring comprising a gate electrode, a data wiring comprising a data line, a source electrode connected to the data line and a drain electrode connected to a pixel electrode, and a semiconductor layer disposed between the gate wiring and the data wiring and forming a channel area between the source electrode and the drain electrode, wherein the semiconductor layer overlapped by the drain electrode is disposed within an area of the gate electrode, and the semiconductor layer overlapped by the source electrode extends outward from the gate electrode.

The foregoing and/or other aspects of the present invention are also achieved by providing a manufacturing method for a TFT substrate for a display apparatus comprising forming a gate wiring comprising a gate electrode by depositing gate wiring material and patterning, forming on the gate wiring a semiconductor layer overlapping the gate electrode partly, and forming a source electrode and a drain electrode by depositing data wiring material and patterning, the semiconductor layer under the source electrode extending outward from the gate electrode and the semiconductor layer under the drain electrode being disposed within an area of the gate electrode.

According to an embodiment of the present invention, a part of the source electrode may extend outward from the gate electrode (i.e., into an area not overlapping the gate electrode) in the aforementioned embodiments.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which:

FIGS. 6A to 8B are diagrams illustrating a manufacturing process of a TFT substrate according to the first embodiment of the present invention;

DETAILED DESCRIPTION

Reference will now be made in detail to exemplary embodiments of the present invention, examples of which are illustrated in the accompanying drawings, wherein like reference numerals refer to like elements throughout. The embodiments are described below in order to explain the present invention by referring to the figures.

A TFT substrate 1 according to a first embodiment will be described below by referring to FIGS. 1 to 5.

Referring now to FIGS. 1 to 4, a gate wiring 21 and 22 is formed on an insulating substrate 11. The gate wiring 21 and 22 comprises a gate line 21 extending in a transverse direction and a gate electrode 22 connected to the gate line 21.

A gate insulation layer 31 made of, for example, silicon nitride (SiNx), is formed on the insulating substrate 11 and covers the gate wiring 21 and 22.

A semiconductor layer 32 made of, for example, amorphous silicon, is formed on the gate insulation layer 31 of the gate electrode 22. An ohmic contact layer 33 made of, for example, silicide or n$^+$ hydrogenated amorphous silicon heavily doped with n-type impurity, is formed on the semiconductor layer 32.

A data wiring 41, 42, and 43 is formed on the ohmic contact layer 33 and the gate insulation layer 31. The data wiring 41, 42, and 43 may have a Mo single-layered structure or a Mo/Al/Mo triple-layered structure in one example.

The data wiring 41, 42, and 43 is disposed in a longitudinal direction. The data wiring 41, 42, and 43 comprises a data line 41 intersecting the gate line 21 and defining a pixel, a source electrode 42 branched out from the data line 41 extended to an upper part of the ohmic contact layer 33, and a drain electrode 43 separated from the source electrode 42 and disposed on an upper part of the ohmic contact layer 33 opposite the source electrode 42. The source electrode 42 has a U shape in one example.

Figure 1:
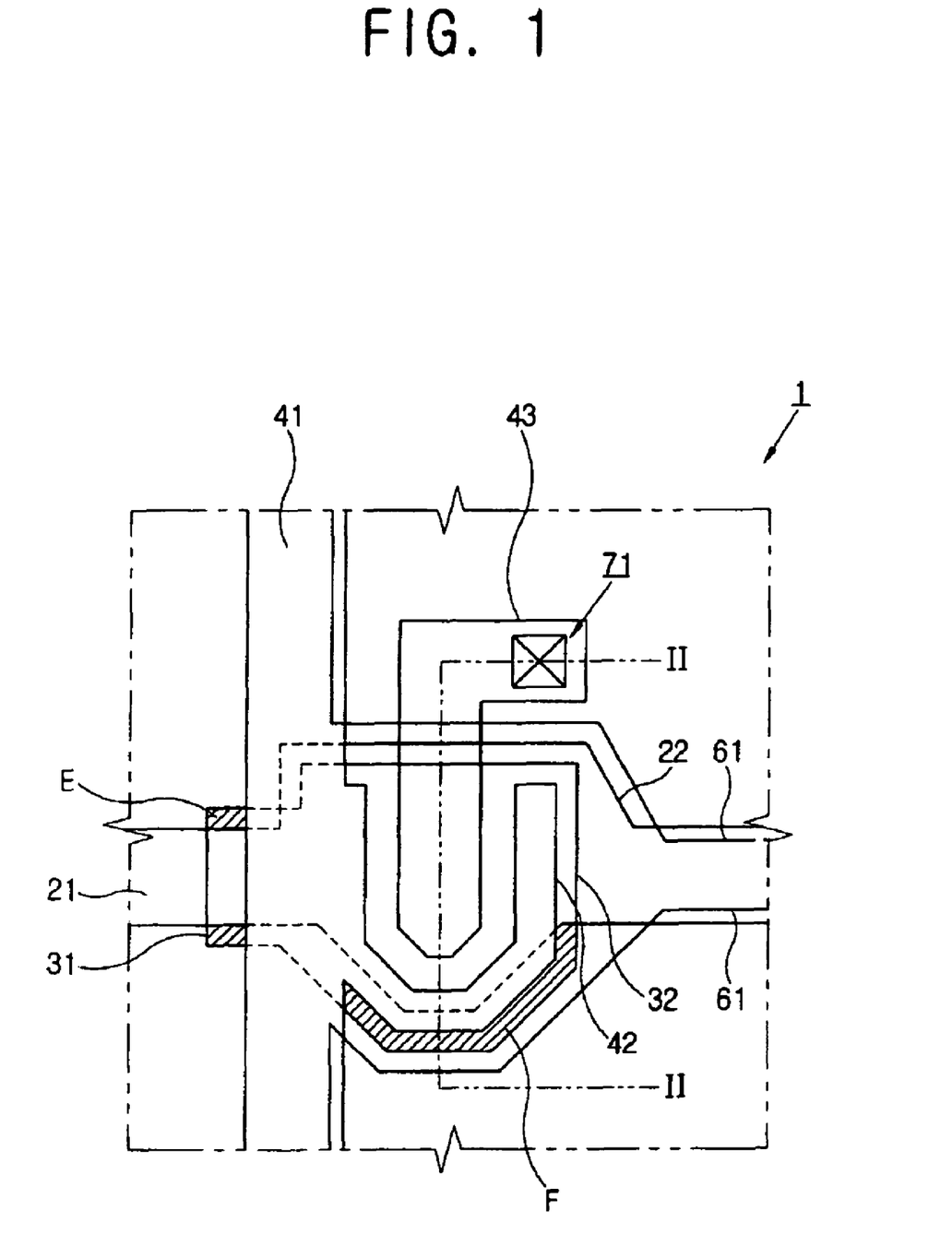
FIG. 1 is a layout view of a TFT substrate according to a first embodiment of the present invention.
Figure 2:
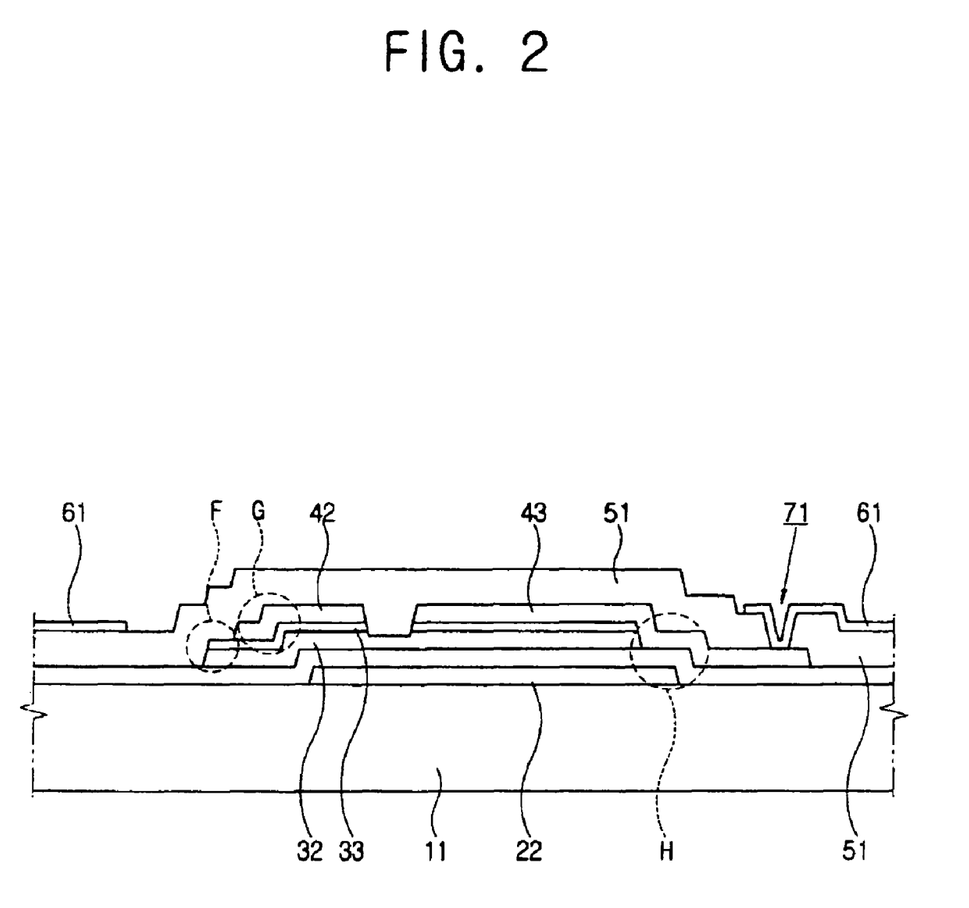
FIG. 2 is a sectional view taken along the II-II line of FIG. 1.

A passivation layer 51 is formed on the data wiring 41, 42, and 43 and the semiconductor layer 32 uncovered by the data wiring 41, 42 and 43. The passivation layer 51 is preferably made of silicon nitride (SiNx), a-Si:C:O or a-Si:O:F deposited by a plasma enhanced chemical vapor deposition (PECVD) process, and/or acryl-containing organic insulating material. The a-Si:C:O layer and the a-Si:O:F layer deposited by the PECVD process each have low dielectric constants, in one example being lower than 4. Therefore, such layers have little parasitic capacitance even though they are thin in thickness. Also, such layers have good adhesive properties when compared to other layers and high step coverage. Further, since such layers are made of inorganic material, they have a higher thermostability than organic insulating layers.

The passivation layer 51 has a contact hole 71 exposing the drain electrode 43. A pixel electrode 61 is formed on the passivation layer 51 and is electrically connected to the drain electrode 43 through the contact hole 71 and disposed in a pixel area. The pixel electrode 61 is made of transparent conducting material such as indium tin oxide (ITO) or indium zinc oxide (IZO). Here, the pixel electrode 61 overlaps the gate line 21, thereby composing a storage capacitor. A storage capacitance wiring may be added in the same layer where the gate wiring 21 and 22 is disposed to increase the storage capacitance.

A layout of the gate wiring 21 and 22, the semiconductor layer 32, and the data wiring 41, 42, and 43 in the TFT substrate 1 will be further described below.

Figure 3:
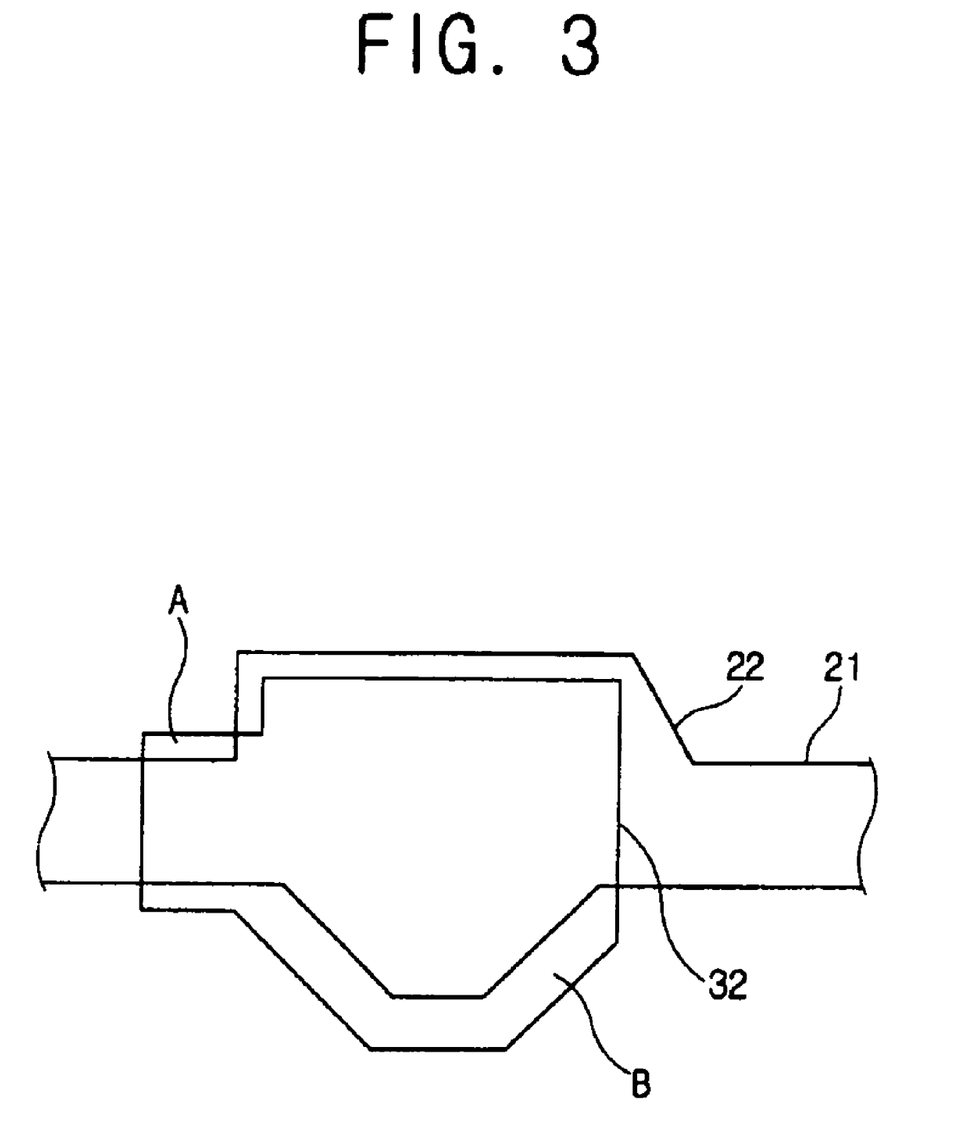
FIG. 3 is a layout view of a gate wiring and a semiconductor layer according to the first embodiment of the present invention.

Referring to FIG. 3, a layout of the gate wiring 21 and 22 and the semiconductor layer 32 will be described first. A large portion of the semiconductor layer 32 overlaps the gate electrode 22, but some portions A and B of the semiconductor layer 32 do not overlap the gate electrode 22. In such a structure, the size of the gate electrode 22 can be smaller because the gate electrode 22 does not need to cover the entire semiconductor layer 32. The drain electrode 43 is formed on an area where the semiconductor layer 32 overlaps the gate electrode 22 entirely, and the source electrode 42 is formed on an area where the semiconductor layer 32 extends outward from the gate electrode 22 (see, e.g., FIG. 2) into an area which does not overlap the gate electrode 22.

Figure 4:
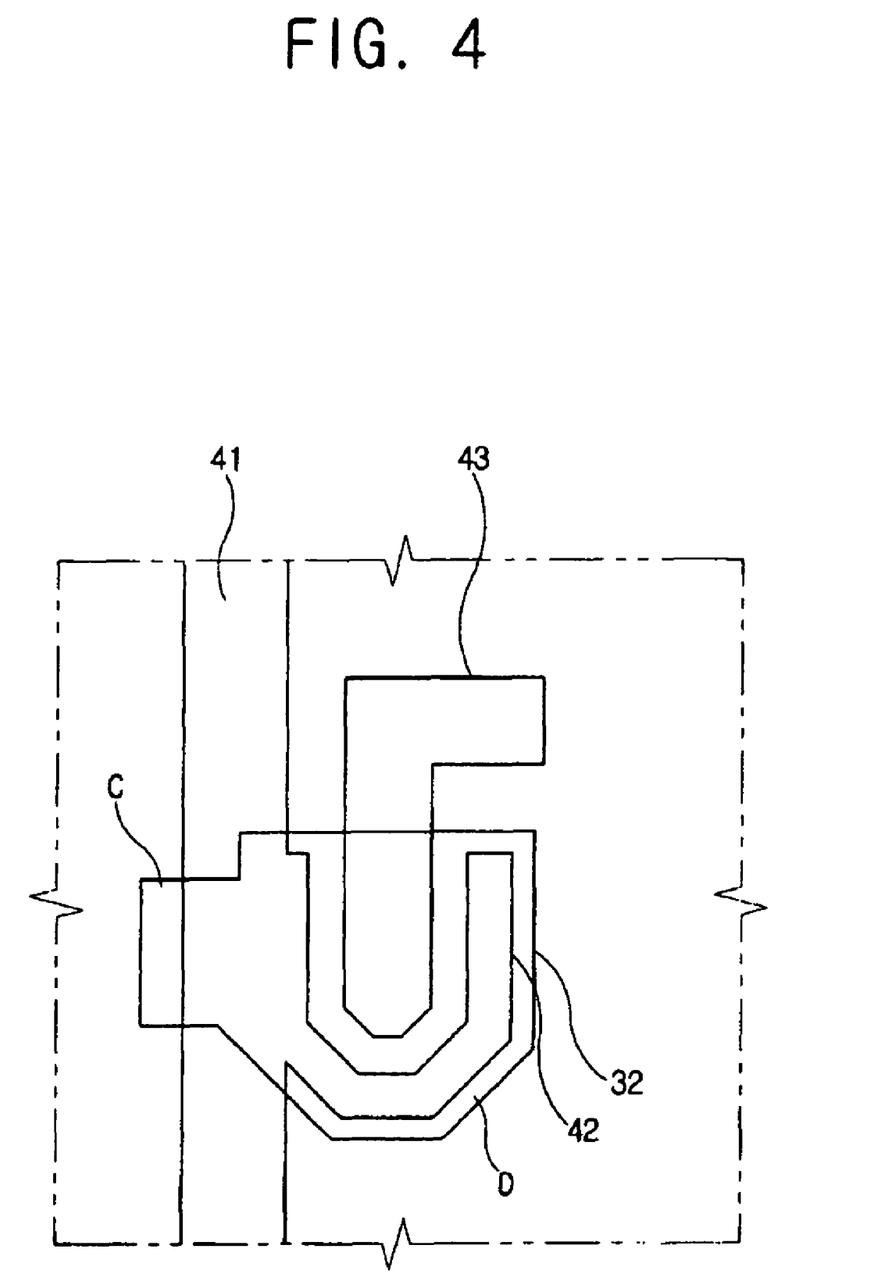
FIG. 4 is a layout view of a semiconductor layer and a data wiring according to the first embodiment of the present invention.

Referring to FIG. 4, a layout of the semiconductor layer 32 and the data wiring 41, 42, and 43 will be described. The whole source electrode 42 overlaps the semiconductor layer 32, but only a portion of the drain electrode 43 overlaps the semiconductor layer 32. Some portions C and D of the semiconductor layer 32 are not covered with the data wiring 41, 42, and 43, and some of such portions are not covered with the gate wiring 21 and 22, either. The areas E and F (FIG. 1) that are not covered by the gate wiring 21 and 22 or the data wiring 41, 42, and 43 are exposed to the light emitted from the backlight.

Figure 5:
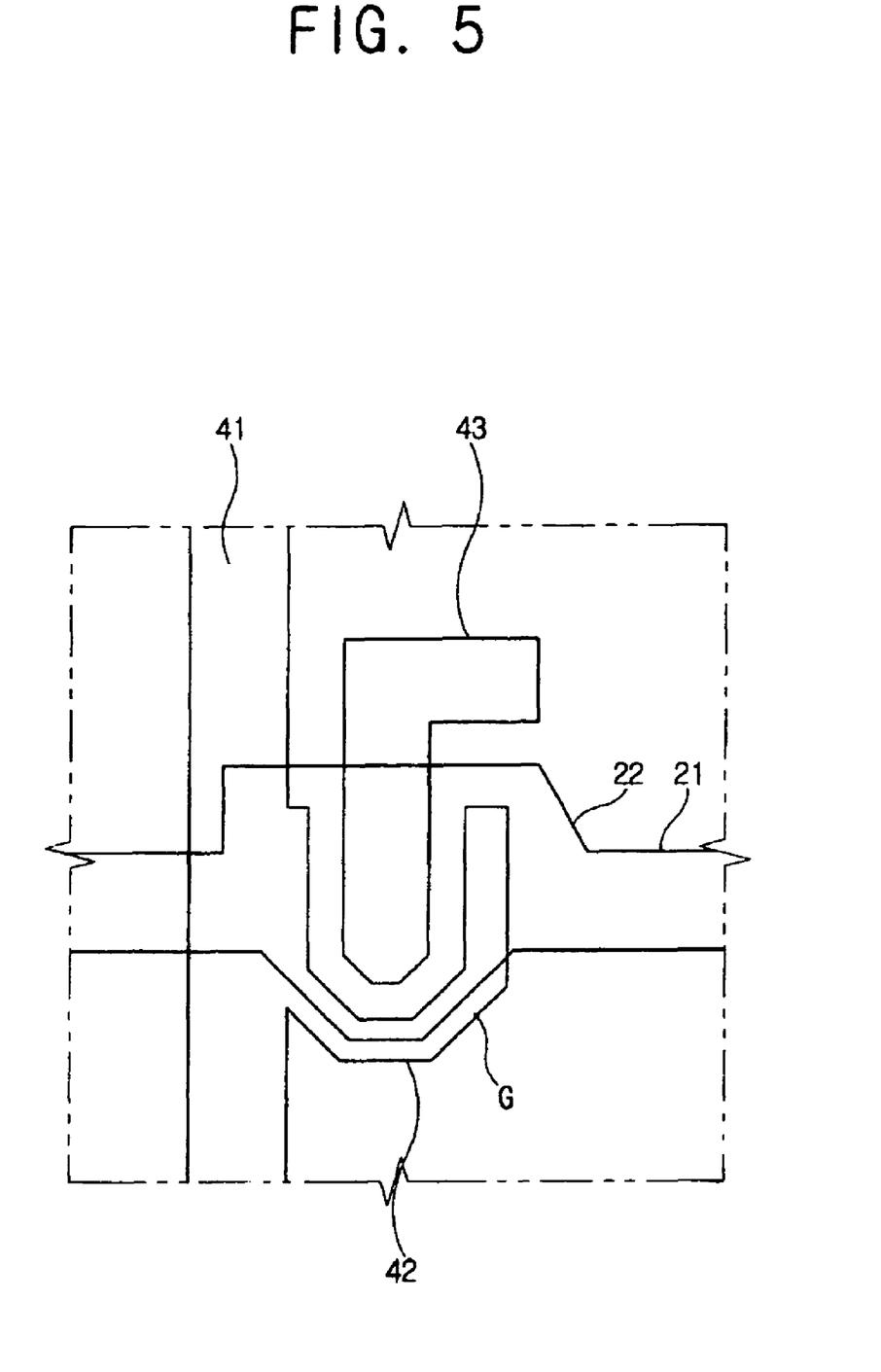
FIG. 5 is a layout view of a gate wiring and a data wiring according to the first embodiment of the present invention.

Referring to FIG. 5, a layout of the gate wiring 21 and 22 and the data wiring 41, 42, and 43 will be described. A portion of the drain electrode 43 overlaps the gate electrode 22, and a portion G of the source electrode 42 does not overlap the gate electrode 22.

Such a TFT substrate has the following advantages.

First, since the semiconductor layer 32 formed under the source electrode 42 is not entirely covered by the gate electrode 22, the size of the gate electrode 22 can be smaller than previously possible in the full island structure. Accordingly, the size of the gate electrode 22 is smaller than in a full island structure, and thus an aperture ratio is higher.

Second, the RC delay between the wirings is decreased. As shown in FIG. 5, a portion G of the source electrode 42 is extended outward from the gate electrode 22. Thus, the area where the source electrode 42 and the gate electrode 22 overlap becomes reduced, thereby decreasing the RC delay.

Third, the afterimaging caused by a leakage current occurs less. The semiconductor layer 32 formed under the drain electrode 43 is entirely covered by the gate electrode 22 (refer to H in FIG. 2) so that the leakage current from the drain electrode 43 to the source electrode 42 is not generated. On the other hand, the areas E and F (FIG. 1) that are not covered by the gate electrode 22 or the source electrode 42 are exposed to the light emitted from the backlight. Accordingly, the leakage current from the source electrode 42 to the drain electrode 43 is generated, because a hole current is initially generated from the area E and F of the semiconductor layer 42 exposed to the light from the backlight. However, the leakage current from the source electrode 42 to the drain electrode 43 does not induce afterimaging because afterimages are caused by the leakage current from the drain electrode 43 to the source electrode 42.

The above embodiments can be modified in various ways. For example, the area E of the semiconductor layer 32 may overlap the gate line 21 or the data line 41 so that the area E is not exposed to the light emitted from the backlight.

Figure 6A:
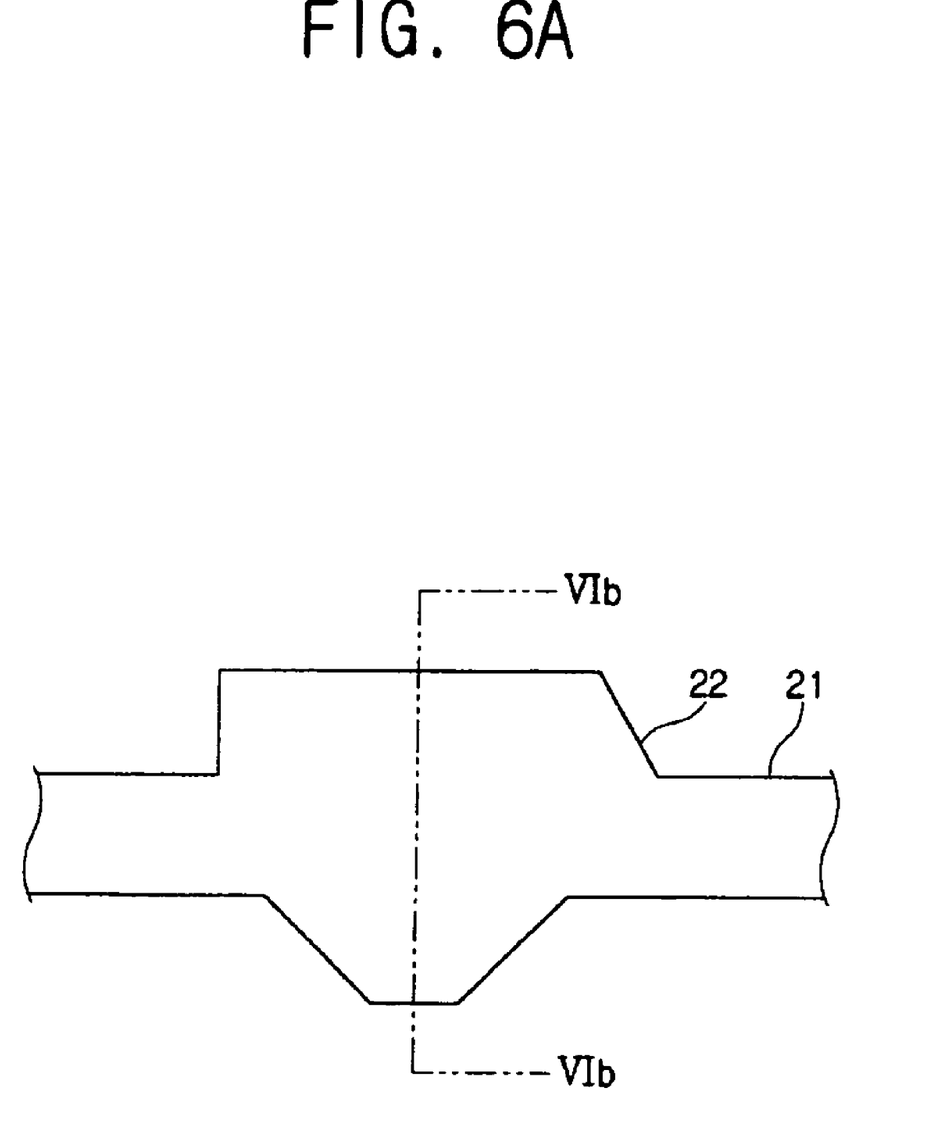
Figure 6B:
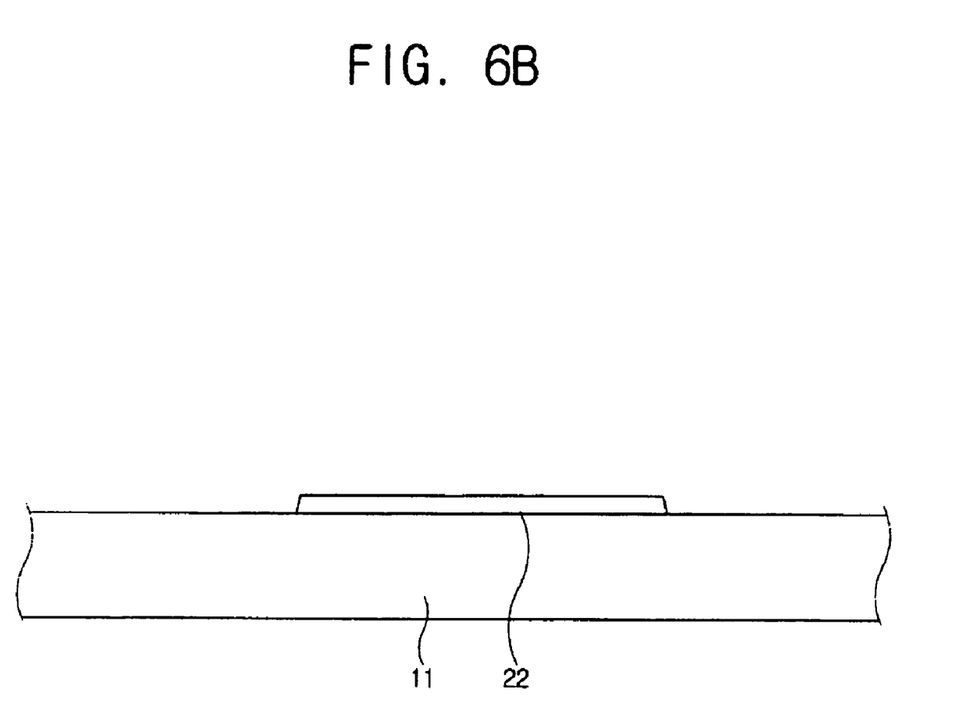
Figure 7A:
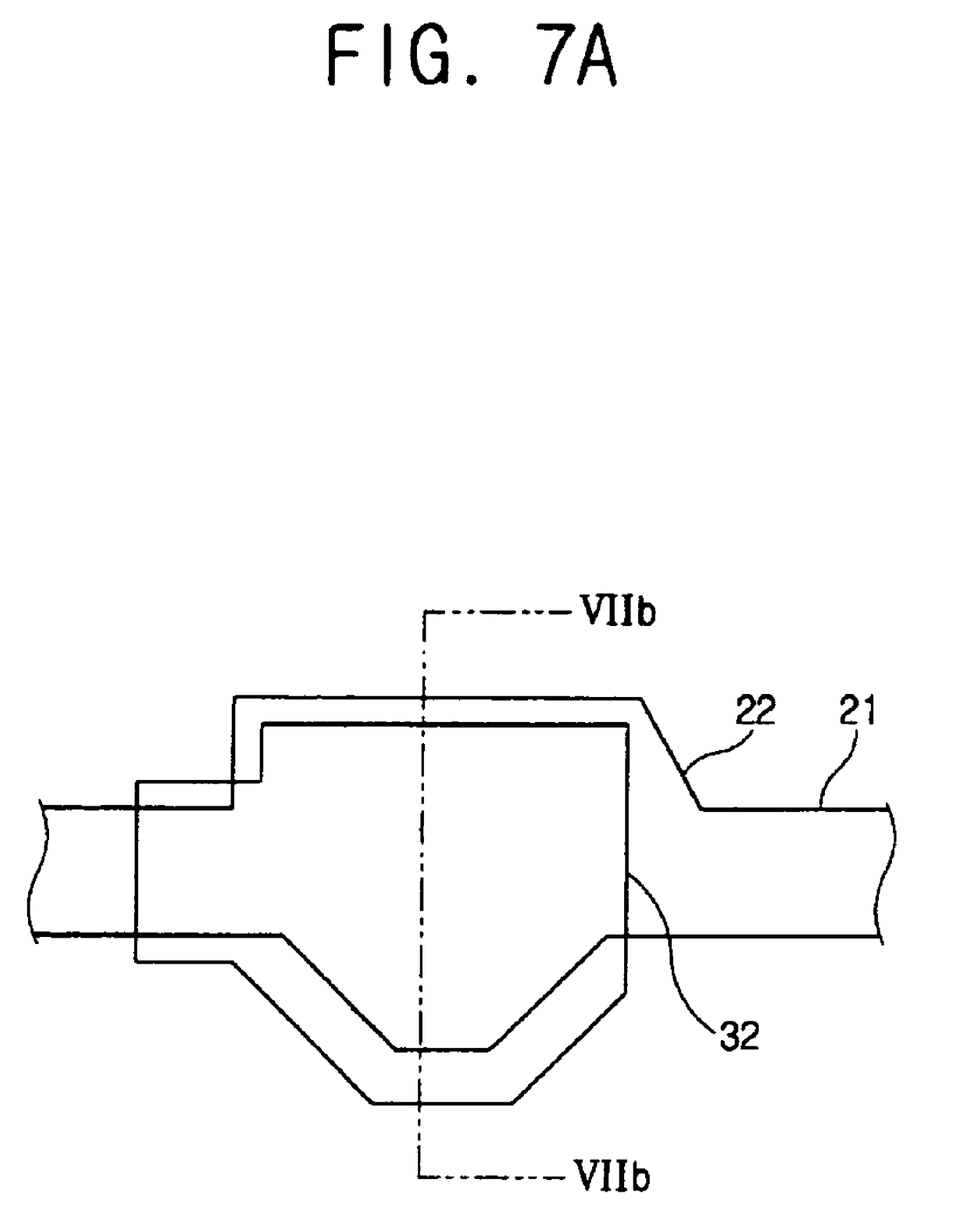
Figure 7B:
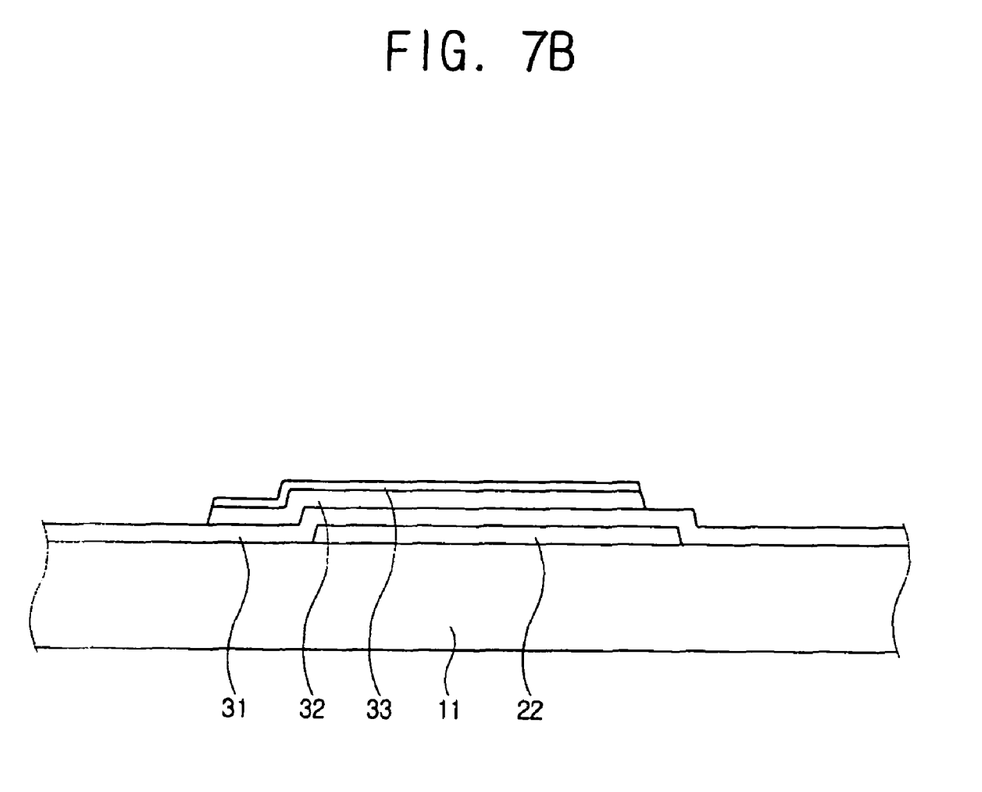
Figure 8A:
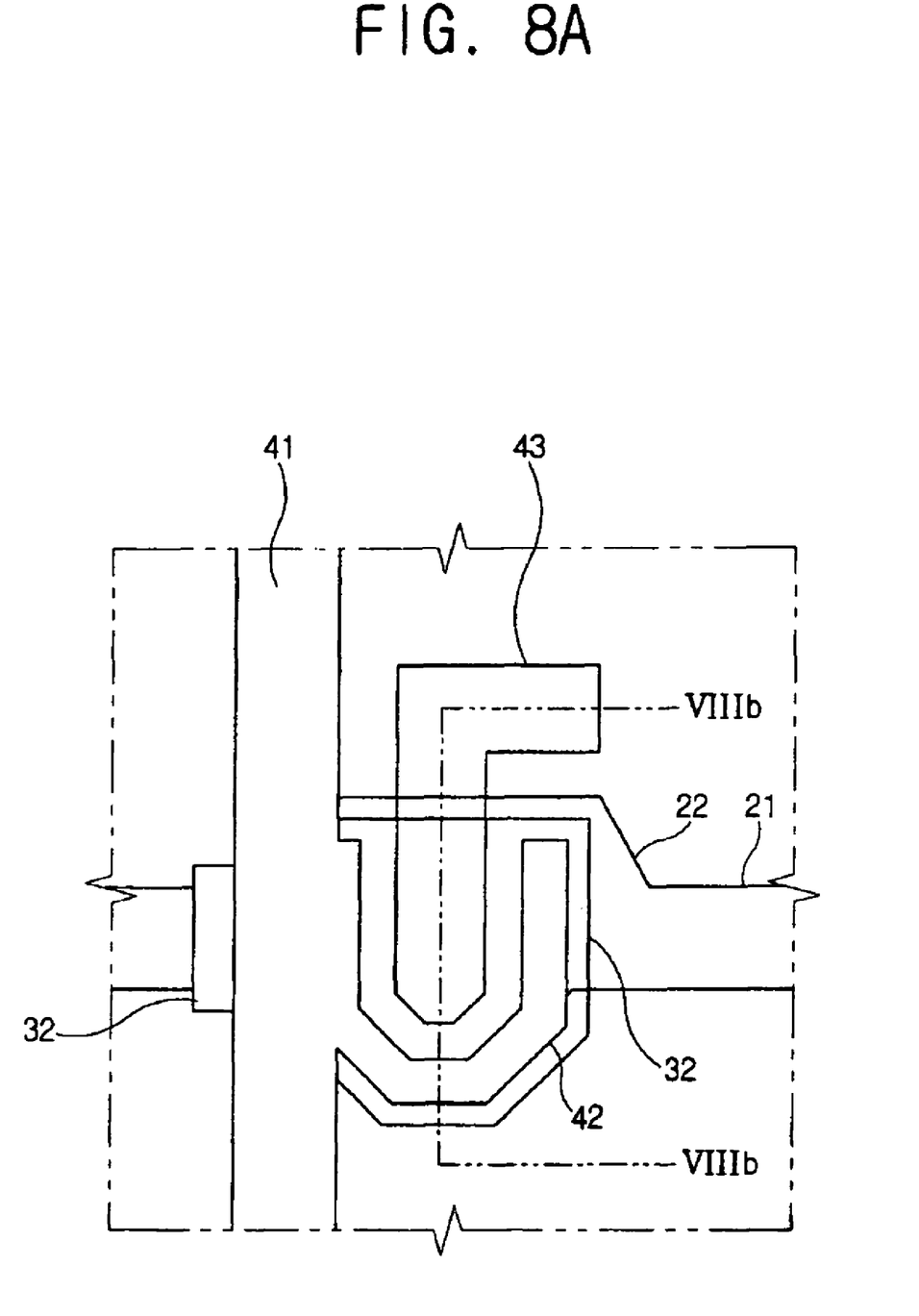
Figure 8B:
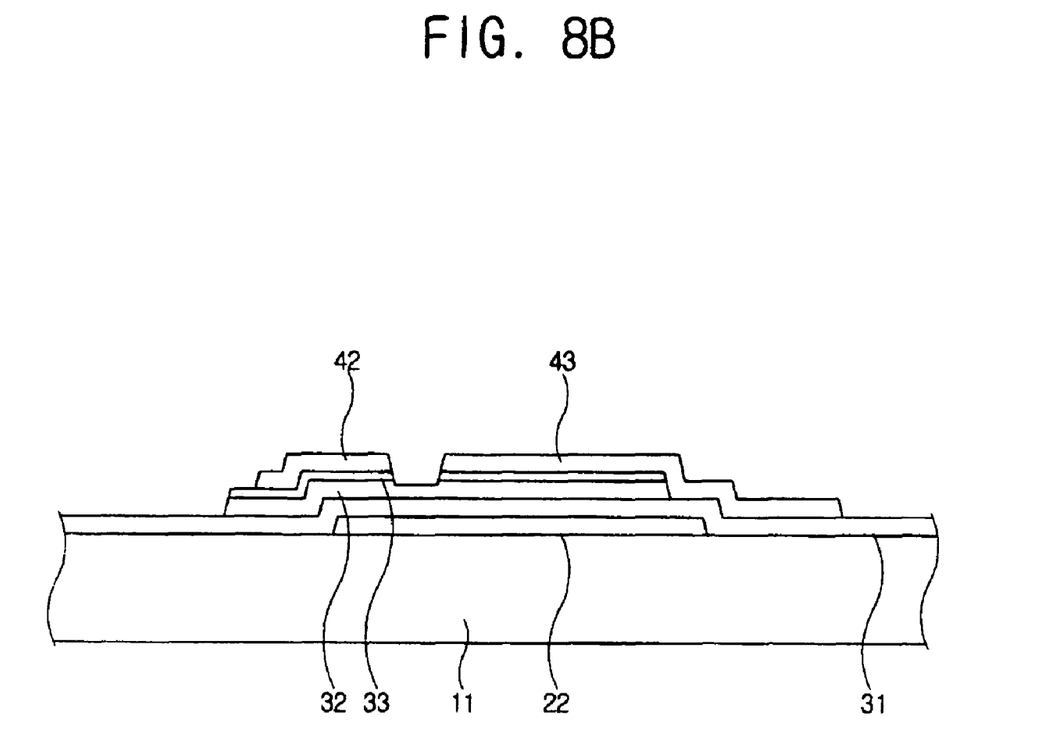

Referring now to FIGS. 6A to 8B, a fabricating process of a TFT according to the first embodiment will be described. FIG. 6B, FIG. 7B, and FIG. 8B are sectional views of the FIG. 6A, FIG. 7A, and FIG. 8A along lines VIB-VIB, VIIB-BIIB, and VIIIB-VIIIB, respectively.

First, as shown in FIGS. 6A and 6B, the gate wiring 21 and 22 comprising the gate line 21 and the gate electrode 22 is formed on the insulating substrate 11 by depositing gate wiring material and then patterning by photolithography using a mask. The gate electrode 22 is formed smaller than in the full island structure, thereby enhancing the aperture ratio.

Next, as shown in FIGS. 7A and 7B, layer 31 made of silicon nitride, layer 32 made of amorphous silicon, and layer 33 made of amorphous silicon are deposited sequentially. Then, as shown in FIGS. 8A and 8B, the semiconductor layer 32 and the ohmic contact layer 33 are formed on the gate insulation layer 31 over the gate electrode 22 by photolithography of layer 32 and layer 33. A portion of the semiconductor layer 32, on which the drain electrode 43 is to be formed, is formed within the area of the gate electrode 22. Another portion of the semiconductor layer 32, on which the source electrode 42 is to be formed, extends outward from the gate electrode 22. Accordingly, the semiconductor layer 32 partially overlaps the gate electrode 22.

Afterwards, as further shown in FIGS. 8A and 8B, the data wiring 41, 42, and 43 is formed by depositing data wiring material and then patterning by photolithography using a mask. The data wiring 41, 42, and 43 comprises the data line 41 intersecting the gate line 21, the source electrode 42 connected to the data line 41 and extending over the gate electrode 22, and the drain electrode 43 separated from and opposing the source electrode 42. Subsequently, the doped amorphous silicon layer 33 which is not covered by the data wiring 41, 42, and 43 is etched thereby dividing the doped amorphous silicon layer 33 into two parts and exposing the semiconductor layer 32 between the two divided, doped amorphous silicon layers 33. Then, an oxygen plasma treatment is preferably performed on the exposed semiconductor layer 32 to stabilize the exposed surface.

In one example, the data wiring 41, 42, and 43 may have a Mo single-layered structure or a Mo/Al/Mo triple-layered structure.

The source electrode 42 has a U shape, and some portions of the source electrode 42 do not overlap the gate electrode 22. The drain electrode 43 overlaps the gate electrode 22 partly, and the semiconductor layer 32 under the drain electrode 43 is disposed within the area of the gate electrode 22.

Afterwards, as shown in FIGS. 1 and 2, a passivation layer 51 is formed by growing silicon nitride, a-Si:C:O, or a-Si:O:F using a chemical vapor deposition (CVD) process or coating an organic insulation layer. Next, the contact hole 71 exposing the drain electrode 33 is formed by a photolithographic process.

Finally, an ITO or IZO layer is deposited and then patterned by photolithography to form the pixel electrode 61 connected to the drain electrode 33 through the contact hole 71, resulting in accomplishing the TFT substrate 1.

Figure 9:
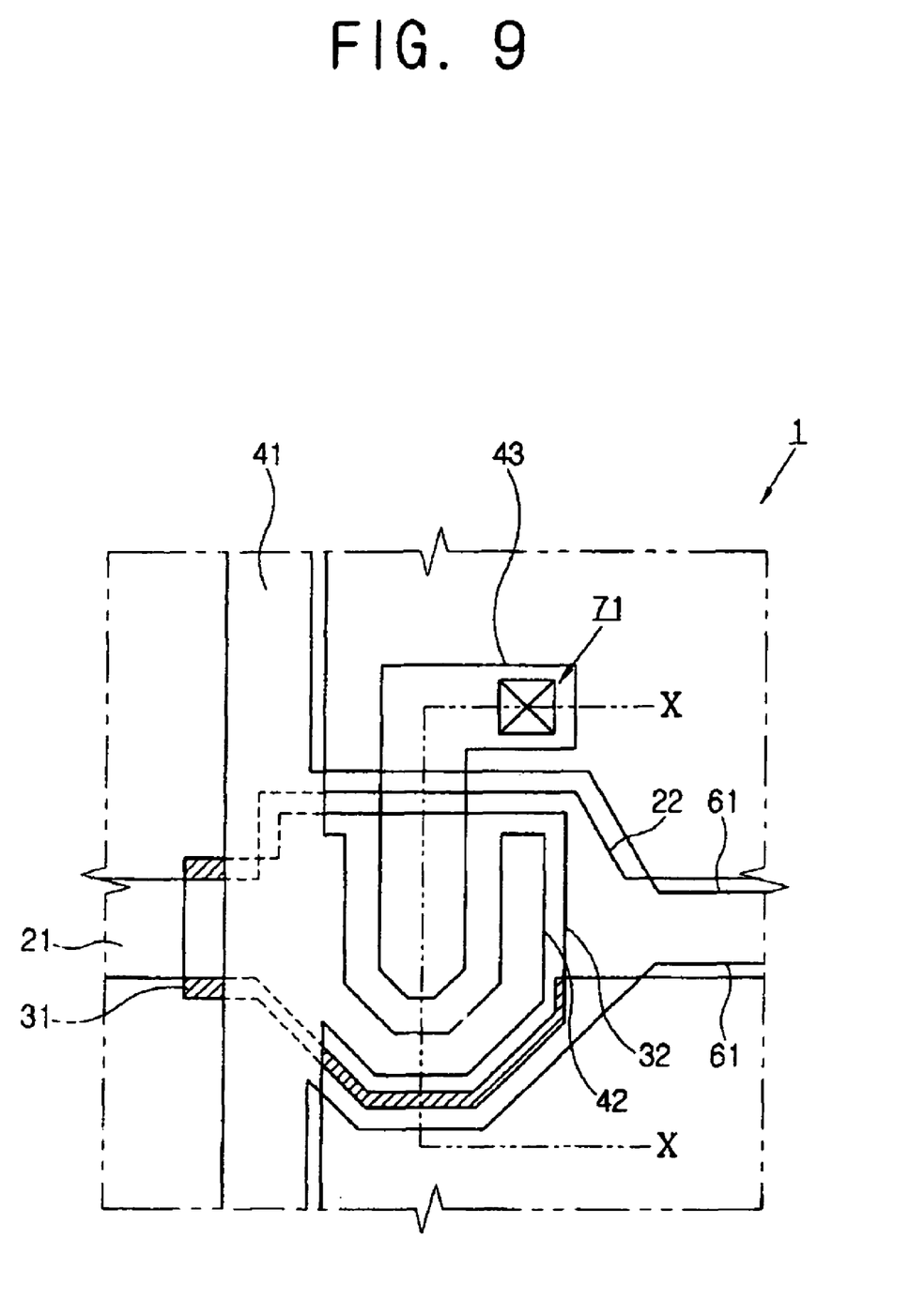
FIG. 9 is a layout view of a TFT substrate according to a second embodiment of the present invention.
Figure 10:
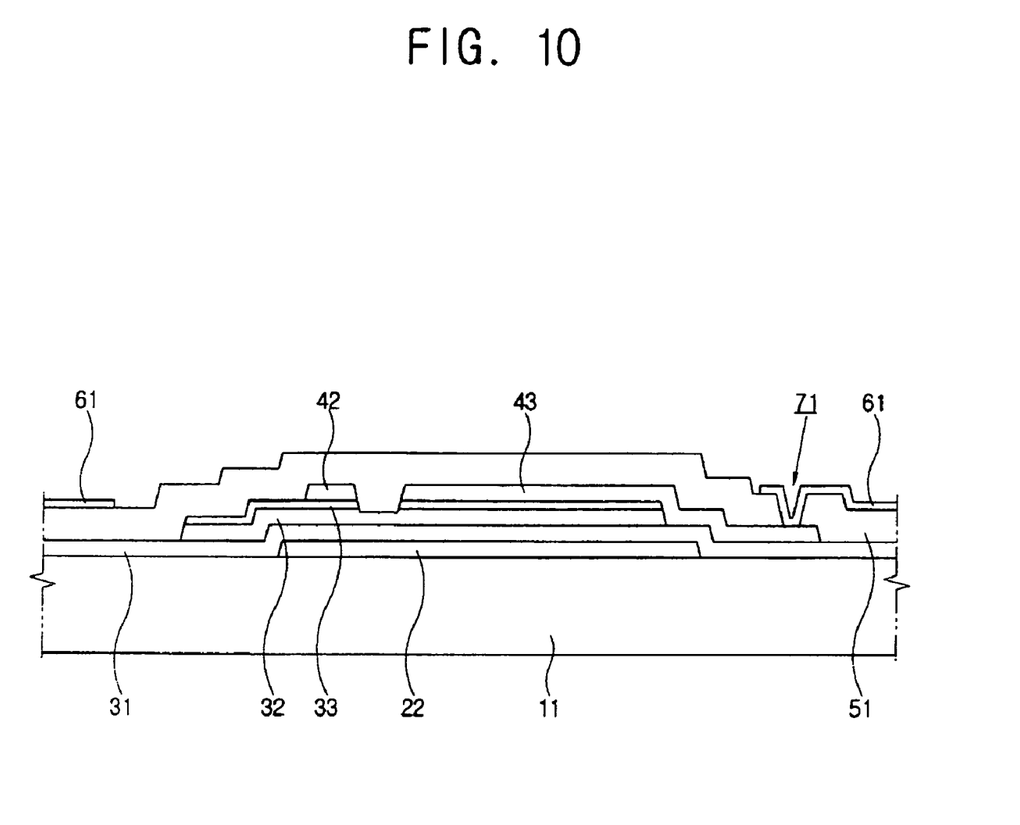
FIG. 10 is a sectional view taken along the X-X line of FIG. 9.

A TFT substrate according to a second embodiment will be described below with reference to FIGS. 9 and 10.

Unlike the first embodiment, a whole source electrode 42 overlaps a gate electrode 22. Like the first embodiment, the whole semiconductor layer 32 under a drain electrode 43 overlaps the gate electrode 22, and a semiconductor layer 32 under the source electrode 42 extends outward from the gate electrode 22.

According to the second embodiment, an area where the source electrode 42 and the gate electrode 22 overlap becomes larger, thereby increasing RC delay. However, the size of the gate electrode 22 becomes smaller than in a full island structure, thereby enhancing the aperture ratio. Moreover, a leakage current directed from the drain electrode 43 to the source electrode 42 is not generated, thereby reducing afterimaging.

Figure 11:
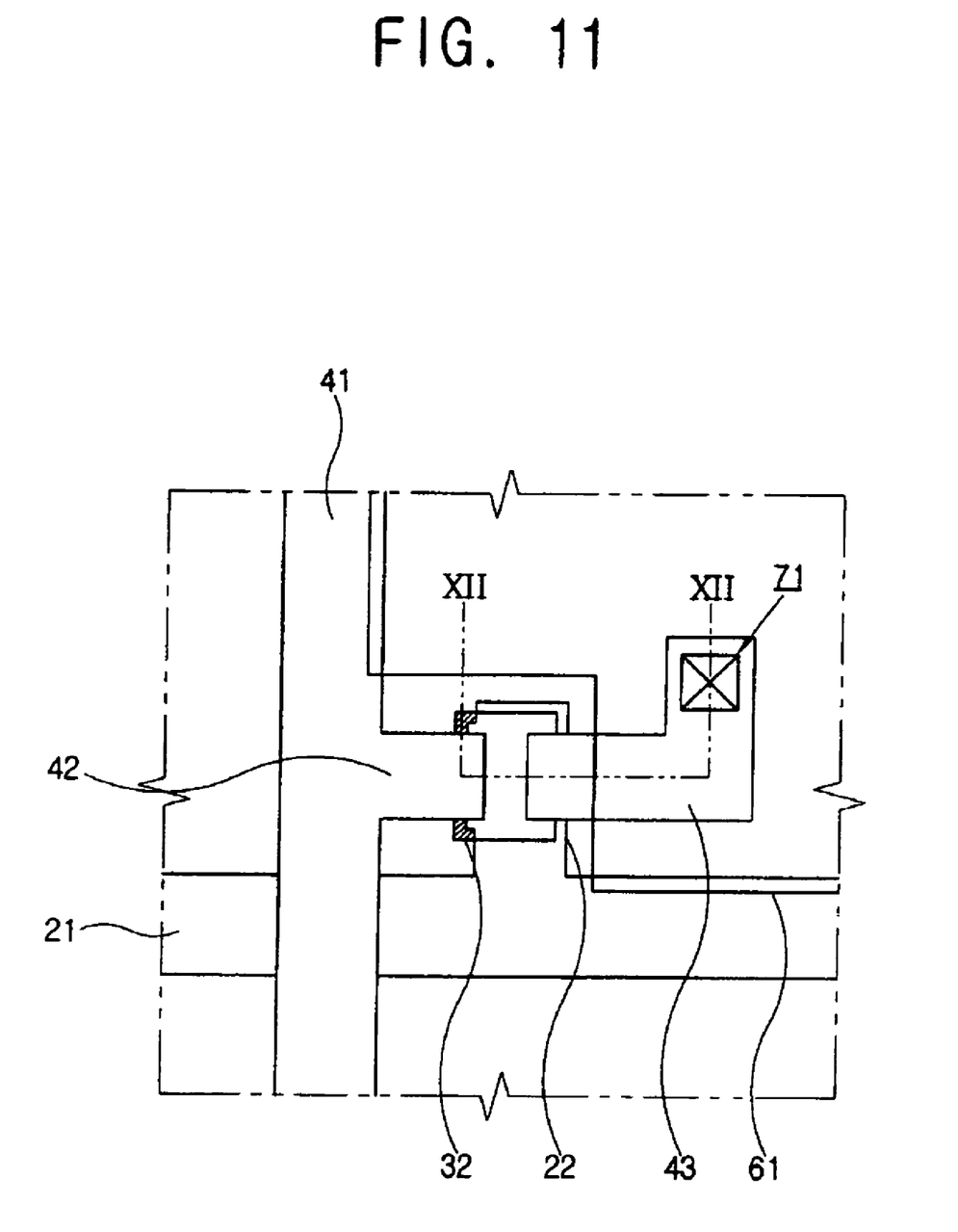
FIG. 11 is a layout view of a TFT substrate according to a third embodiment of the present invention.
Figure 12:
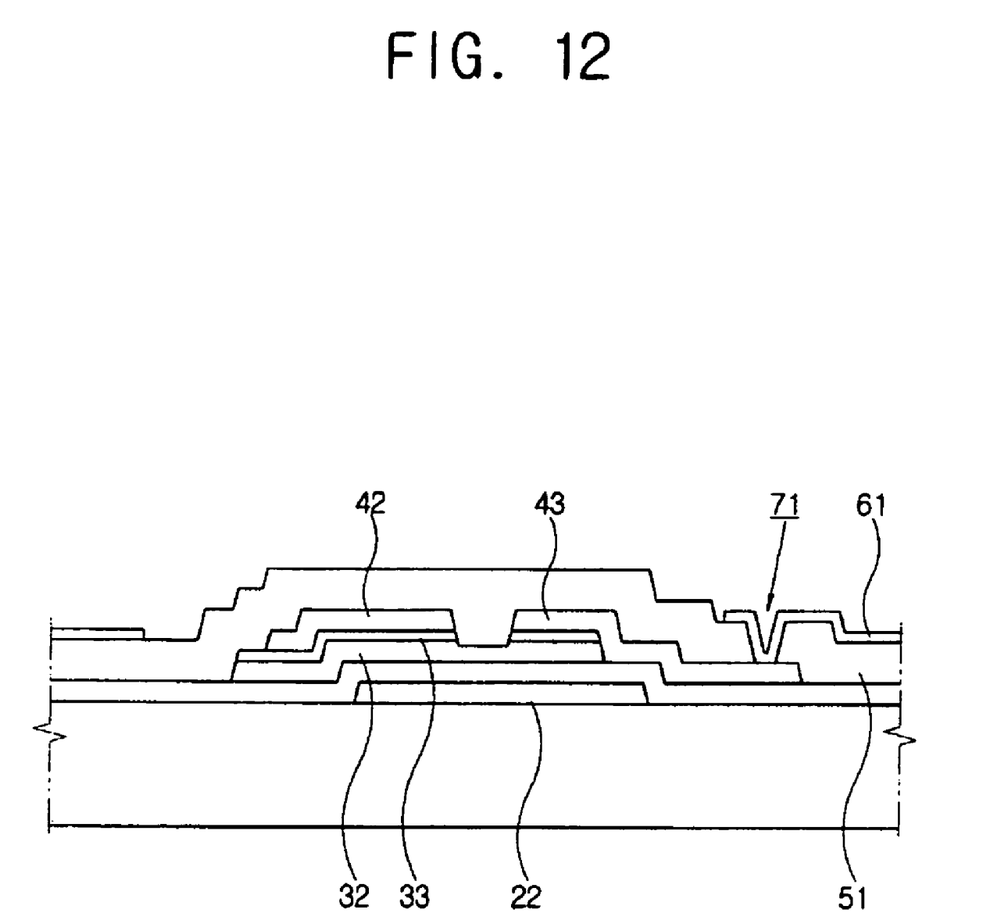
FIG. 12 is a sectional view taken along the XII-XII line of FIG. 11.

A TFT substrate according to a third embodiment will be described below with reference to FIGS. 11 and 12.

Unlike the first embodiment, a channel area has a straight shape. Like the first embodiment, a whole semiconductor layer 32 under a drain electrode 43 overlaps the gate electrode 22, and a semiconductor layer 32 under a source electrode 42 extends outward from the gate electrode 22.

According to the third embodiment, the size of the gate electrode 22 becomes smaller than in a full island structure, thereby enhancing the aperture ratio. Also, there is no leakage current directed from the drain electrode 43 to the source electrode 42, thereby reducing afterimaging.

The TFT and the TFT substrate according to the embodiment of the present invention can be employed in not only LCDs but also in organic light emitting diodes (OLEDs)

Here, the OLED uses an organic material that emits light by itself when it receives an electric signal. Such an OLED having a layered structure comprises a cathode layer (pixel electrode), a hole injecting layer, a hole transporting layer, a light-emitting layer, an electron transportation layer, an electron implantation layer, and an anode layer (counter electrode). According to the embodiments of the present invention, the drain contact part of the TFT substrate is electrically connected with the cathode layer, thereby transmitting a data signal. On the other hand, the drain contact part of the TFT substrate can be electrically connected with the anode layer.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A TFT substrate for a display apparatus, comprising:
a gate wiring including a gate electrode;
a data wiring including a data line, a source electrode connected to the data line, and a drain electrode connected to a pixel electrode; and
a semiconductor layer disposed between the gate wiring and the data wiring,
wherein the source electrode includes a portion extended along the gate electrode, and an edge of the gate electrode passes through a portion of the extended portion of the source electrode, and
a first portion of an end of the semiconductor layer closer to the drain electrode than the source electrode overlaps with the gate electrode.

2. The TFT substrate of claim 1, wherein the source electrode has a substantially "U" shape.

3. The TFT substrate of claim 1, wherein a second portion of the end of the semiconductor layer closer to the source electrode than the drain electrode extends outward from the gate electrode.

4. The TFT substrate of claim 2, wherein a second portion of the end of the semiconductor layer closer to the source electrode than the drain electrode extends outward from the gate electrode.

5. The TFT substrate of claim 1, wherein the source electrode has first and second edges opposite to each other,
the drain electrode has third and fourth edges opposite to each other,
the first edge and the third edge face each other and are disposed on the gate electrode, and the second edge which does not face the drain electrode extends outward from the gate electrode.

6. The TFT substrate of claim 5, wherein the gate wiring further includes a gate line and the gate electrode includes an extended width greater than the gate line.

7. The TFT substrate of claim 6, wherein a second portion of the end of the semiconductor layer closer to the source electrode than the drain electrode extends outward from the gate electrode.

8. The TFT substrate of claim 5, wherein a second portion of the end of the semiconductor layer closer to the source electrode than the drain electrode extends outward from the gate electrode.

9. The TFT substrate of claim 1, wherein the gate wiring further includes a gate line and the gate electrode includes an extended width greater than the gate line.

10. The TFT substrate of claim 9, wherein the source electrode has a substantially "U" shape.

11. The TFT substrate of claim 10, wherein a second portion of the end of the semiconductor layer closer to the source electrode than the drain electrode extends outward from the gate electrode.

12. The TFT substrate of claim 9, wherein a second portion of the end of the semiconductor layer closer to the source electrode than the drain electrode extends outward from the gate electrode.

* * * * *